US008750529B2

(12) United States Patent
Shidoji et al.

(10) Patent No.: US 8,750,529 B2

(45) Date of Patent: Jun. 10, 2014

(54) SIGNAL PROCESSING APPARATUS

(75) Inventors: Hiroomi Shidoji, Hamamatsu (JP); Noriyuki Ohashii, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 258 days.

(21) Appl. No.: 12/780,727

(22) Filed: May 14, 2010

(65) Prior Publication Data

US 2010/0290628 A1 Nov. 18, 2010

(30) Foreign Application Priority Data

May 14, 2009 (JP) ................................ 2009-117197

(51) Int. Cl.
*H03G 3/00* (2006.01)

(52) U.S. Cl.
USPC ................................ 381/63; 381/61; 700/94

(58) Field of Classification Search
USPC ........ 381/1, 17, 27, 61, 63, 104–109; 700/94; 704/225–226
See application file for complete search history.

(56) References Cited

U.S. PATENT DOCUMENTS

| | | | | |
|---|---|---|---|---|
| 5,381,482 | A | 1/1995 | Matsumoto et al. | |
| 5,680,464 | A | 10/1997 | Iwamatsu | |
| 8,184,834 | B2 * | 5/2012 | Oh et al. | 381/300 |
| 8,254,597 | B2 * | 8/2012 | Sakai et al. | 381/107 |
| 2005/0201565 | A1 * | 9/2005 | Choi et al. | 381/61 |
| 2010/0092002 | A1 * | 4/2010 | Yoshino et al. | 381/63 |
| 2010/0290630 | A1 * | 11/2010 | Berardi et al. | 381/17 |

FOREIGN PATENT DOCUMENTS

| | | | |
|---|---|---|---|
| CA | 2 700 911 | A1 | 4/2009 |
| DE | 10 2007 048 973 | A1 | 4/2009 |
| EP | 0 553 832 | A1 | 8/1993 |
| JP | H06165079 | A | 6/1994 |
| JP | A-8-275300 | | 10/1996 |

OTHER PUBLICATIONS

European Search Report mailed Aug. 18, 2010, for EP Application No. 10162659.6, seven pages.

Notification of Reasons for Refusal mailed Feb. 18, 2014, for JP Application No. 2010-069801, with English translation, seven pages.

* cited by examiner

*Primary Examiner* — Disler Paul

(74) *Attorney, Agent, or Firm* — Morrison & Foerster LLP

(57) ABSTRACT

A signal processing apparatus is provided. The signal processing apparatus comprises: an inputting section for inputting audio signals on a plurality of channels; an acoustic type acquiring section which is adapted to acquire an acoustic type of an audio signal on at least one channel of the audio signals; and a process controlling section which is adapted to control a characteristic of sound-field effect applied to the audio signals based on the acquired acoustic type.

10 Claims, 7 Drawing Sheets

| CHANNEL | CONTENT | CONTROLLED AMOUNT OF SOUND FIELD |
|---|---|---|
| C | TALKING VOICE | SMALL |
| FL | MUSICAL SOUND | LARGE |
| FR | MUSICAL SOUND | LARGE |
| SL | OTHER SOUND | MIDDLE |
| SR | OTHER SOUND | MIDDLE |

| CHANNEL | CONTENT | CONTROLLED AMOUNT OF SOUND FIELD |
|---|---|---|
| C | — | — |
| FL | TALKING VOICE + MUSICAL SOUND | SMALL |
| FR | MUSICAL SOUND | SMALL (LARGE/MIDDLE) |
| SL | OTHER SOUND | MIDDLE |
| SR | OTHER SOUND | MIDDLE |

SIGNAL PROCESSING APPARATUS

BACKGROUND OF THE INVENTION

1. Technical Field

The present invention relates to a signal processing apparatus for producing an effect according to the content of the input audio signal.

2. Background Art

Recently, a multi-channel audio equipment is spreading. The multi-channel audio equipment denotes an equipment that can reproduce audio sounds with three-dimensional soundscape, by reproducing audio signals in the channels whose number is larger than the stereo 2-channels such as 5.1 channels, or the like (multi-channel), and then outputting these signals from a plurality of speakers that are set up at respective locations of the room (JP-A-8-275300).

In the background art, the content whose multi-channel audio signals can be reproduced in the ordinary home are limited to the movie content recorded in the DVD, or so. In the movie content, the channel assignment indicating which acoustic types of the audio signals should be assigned to respective channels is substantially standardized. The acoustic type is based on content of acoustics. As the content of acoustics, there can be considered talking voices such as one's lines, musical sound such as BGM, or other sounds such as ambient sounds or sound effects. For example, it is general that the talking voices are assigned to the center channel, the musical sounds are assigned to the front left/right channels, and other sounds are assigned to the surround left/right channels.

The multi-channel audio equipment is equipped with the function for performing the sound field control to produce the reverberations of a virtual space such as a hall, or the like, by adding reflected sounds and reverberation sounds to the reproduced audio signals.

However, when the effect such as the reflected sound, the reverberation sound, or the like is added strongly to the talking voices such as one's lines, etc., the articulation is decreased. This makes it hard for the listener to comprehend what the performers are speaking. For this reason, it is common that a controlled amount of sound field on the channel where the talking voices are reproduced is set smaller than those on other channels. As described above, in the case of the movie content, commonly the talking voices such as one's lines, and the like are assigned to the center channel. As a result, in the multi-channel audio equipment in the background art, it is set in advance that a controlled amount of sound field on the center channel should be small and a controlled amount of sound field on other channels should be large or middle.

However, the multi-channel audio content that can be reproduced by the equipment for use at home are diversified on account of the start of the digital terrestrial broadcasting, and the like, and thus the content in which the channel assignment used in the conventional movie, or the like is not employed are increased. That is, the content in which the talking voices are assigned to not the center channel but the front channel or the surround channel are increased.

When such multi-channel audio content is reproduced in the conventional setting for the controlled amount of sound field, the strong reflection or reverberation effect is caused in the talking voices such as one's lines, and the like, and thus a deterioration of the articulation is caused. Also, when the musical sounds such as BGM, etc. are reproduced on the center channel, the sound field effect is not exercised on BGM, so that such problems arise that it is impossible for BGM to enliven the atmosphere, and the like.

SUMMARY OF THE INVENTION

It is an object of the present invention to provide a signal processing apparatus capable of controlling an effect based upon acoustic types of respective channels of multi-channel audio signals to implement an adequate effect production in response to the acoustic types.

According to an aspect of the present invention, there is provided a signal processing apparatus, comprising: an inputting section for inputting audio signals on a plurality of channels; an acoustic type acquiring section which is adapted to acquire an acoustic type of an audio signal on at least one channel of the audio signals; and a process controlling section which is adapted to control a characteristic of sound-field effect applied to the audio signals based on the acquired acoustic type.

The signal processing apparatus may be configured in that the acoustic type acquiring section detects, in the audio signal of a determination target, at least one of: a ratio of energies in a scale frequency component among all energies; whether the audio signal has a spectrum structure including components of fundamental tone and harmonic tone thereof; and change in frequency, and the acoustic type acquiring section performs determination of which type of talking voice, musical sound, or other sound the audio signal indicates based on a result of the detection.

The signal processing apparatus may be configured in that the acoustic type acquiring section performs the determination with respect to audio signals on two or more channels, and further determines which audio signal on a channel indicates the talking voice among the audio signals on the two or more channels.

The signal processing apparatus may be configured in that the process controlling section controls to decrease a sound-field effect applied to the audio signal which is determined to indicate the talking voice.

The signal processing apparatus may be configured in that, when a channel of the audio signal determined to indicate the talking voice is switched, the process controlling section gradually decreases the sound-field effect applied to the audio signal which is determined to indicate the talking voice; the process controlling section gradually increases the sound-field effect applied to the audio signal which is determined to indicate not the talking voice.

The signal processing apparatus may be configured in that the process controlling section controls sound-field effect applied to the audio signal which is determined to indicate the musical sound to be middle more than that applied when determined to the talking voice and less than that applied when determined to the other sound.

The signal processing apparatus may be configured in that audio signals on the plurality of channels including a center channel are input to the inputting section, the signal processing apparatus further comprises a sound-field processing section which is adapted to perform a sound-field effect process including reverberation effect process with respect to signals in which the audio signals on the plurality of channels are synthesized to each other, and to perform adding process for adding the signals subjected to the sound-field effect process to the audio signals on channels except for the center channel, the acoustic type acquiring section determines which audio signal on a channel indicates the talking voice, and when the audio signal on a channel except for the center channel is determined to indicate the talking voice, the process controlling section controls to decrease a level of the signals to be added to the audio signals on the channels except for the center channel.

According to the present invention, the adequate sound-field effect that responds to the acoustic type of the audio signal can be produced by controlling the effect based upon the content of the audio signals on plural channels.

DETAILED DESCRIPTION OF THE EXEMPLARY EMBODIMENTS

<Configuration of the Audio Equipment>

Figures 1, 2A, 2B:
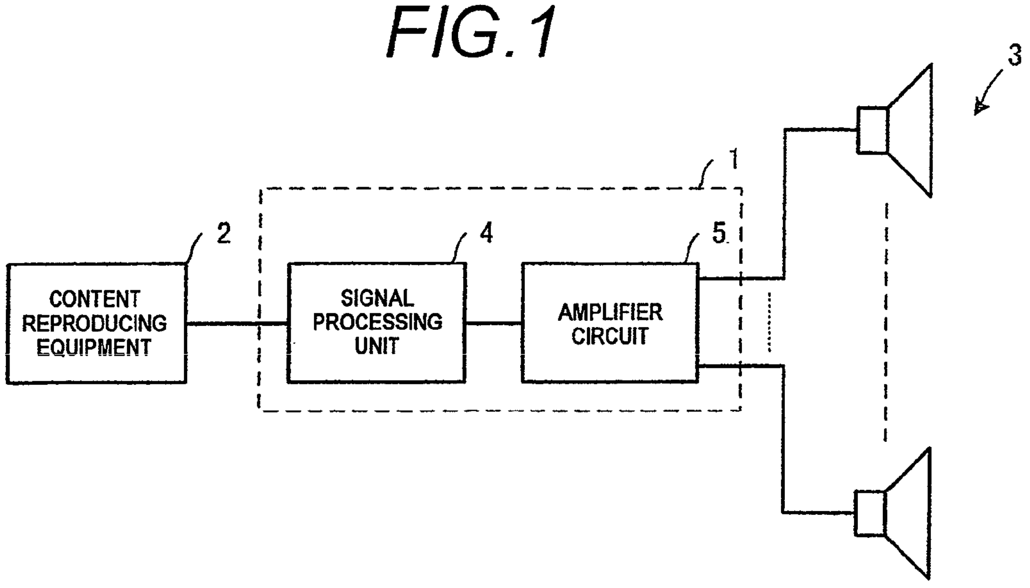
FIG. 1 is a block diagram of an audio equipment including a signal processing unit as an embodiment of the present invention.
FIGS. 2A and 2B show examples of a channel assignment of multi-channel audio signals.

FIG. 1 is a block diagram of an audio equipment including a signal processing unit as an embodiment of the present invention. The audio equipment includes a content reproducing equipment 2, an audio amplifier 1, and a plurality of speakers 3. The audio amplifier 1 has a signal processing unit 4 and an amplifier circuit 5.

The content reproducing equipment 2 includes a DVD player for playing DVD such as movie, or the like, a television broadcasting tuner for receiving a satellite or terrestrial television broadcasting, and the like, for example. The content reproducing equipment 2 inputs multi-channel (e.g., 5.1-channel) audio signals into the audio amplifier 1. The signal processing unit 4 of the audio amplifier 1 applies the processes such as equalizing, sound-field control, etc. to the multi-channel audio signals being input from the content reproducing equipment 2, and then inputs the signals into the amplifier circuit 5. The amplifier circuit 5 amplifies individually the input multi-channel audio signals respectively, and outputs the amplified signals to the speakers 3 corresponding to respective channels.

The plurality of speakers 3 are set up at respective locations in the listening room. When the sounds on respective channels are emitted from the speakers 3, the sound field with the soundscape is produced in the listening room.

<Example of Channel Assignment of the Content>

Here, the channel assignment of the multi-channel audio signals that are input from the content reproducing equipment 2 to the audio amplifier 1 will be explained with reference to FIGS. 2A and 2B hereunder.

FIG. 2A shows an example of the channel assignment of the multi-channel audio signals of the common movie content. In this embodiment, explanation will be made by taking 5.1-channel audio signals as an example. The 5.1-channel audio signals include a center channel C, a front left channel FL, a front right channel FR, a surround (rear) left channel SL, a surround (rear) right channel SR, and a low-frequency effect channel LFE. Out of these channels, the low-frequency effect channel LFE acts as the special effect channel to compensate other 5 channels, and the sound is never output solely from this channel. Accordingly, the channel assignment of 5 channels, which include the center channel C, the front left channel FL, the front right channel FR, the surround left channel SL, and the surround right channel SR, will be explained hereinafter.

In the case of the common content, as the main components, the talking voices such as one's lines, etc. are assigned to the center channel C, the musical sounds such as BGM, etc. are assigned to the front left/right channels FL, FR, and other sounds (ambient sounds, sound effects, etc.) are assigned to the surround left/right channels SL, SR. In many cases, other sounds (ambient sounds, sound effects, etc.) as well as the musical sounds are also contained in the front left/right channels FL, FR.

In general, in order to prevent that the talked content become inarticulate, an amount of the sound field control produced accompanying the talking voice is made small. Also, a controlled amount of sound field of the musical sound such as BGM, etc. is made large to augment the reverberations. Also, a controlled amount of sound field of other sound such as the ambient sound, the sound effects, etc. is set to middle. Under these setting conditions, the excellent sound field effect can be expected when a controlled amount of sound field on the center channel C is set to "small", a controlled amount of sound field on the front left/right channels FL, FR is set to "large", and a controlled amount of sound field on the surround left/right channels SL, SR is set to "middle".

In contrast, FIG. 2B shows an example of the channel assignment of the multi-channel audio signals of the content except the common movie content, e.g., the digital television broadcasting. In this example, the center channel C is silent, the talking voices such as one's lines, etc. and BGM are assigned to the front left channel FL, the musical sounds such as BGM, etc. are assigned to the front right channel FR, and other sounds are assigned to the surround left/right channels SL, SR.

In such case, when the sound effects responding to the content are assigned every channel as explained above, a controlled amount of sound field on the center channel C is arbitrary (the sound field effect is substantially zero because there is no input signal). Also, a controlled amount of sound field on the front left/right channels FL, FR is set to "small", and a controlled amount of sound field on the surround left/right channels SL, SR is set to "middle".

More particularly, the talking voice and the musical sound are synthesized and output to the front left channels FL. In this case, the talking voice has priority, and a controlled amount of sound field on the front left channel FL is set to "small". Also, only the musical sounds are assigned to the front right channel FR. In this case, if a balance of the sound field control between the left/right channels breaks down, it is likely that the listener has the unstable feeling. Therefore, a controlled amount of sound field on the front right channel FR is set to "small" similarly to the front left channels FL. In this event, a controlled amount of sound field on the front right channel FR may be set to "large" so as to fit the musical sound, or may be set to "middle" as a middle level between them.

<Configuration of the Signal Processing Unit>

Figure 3:
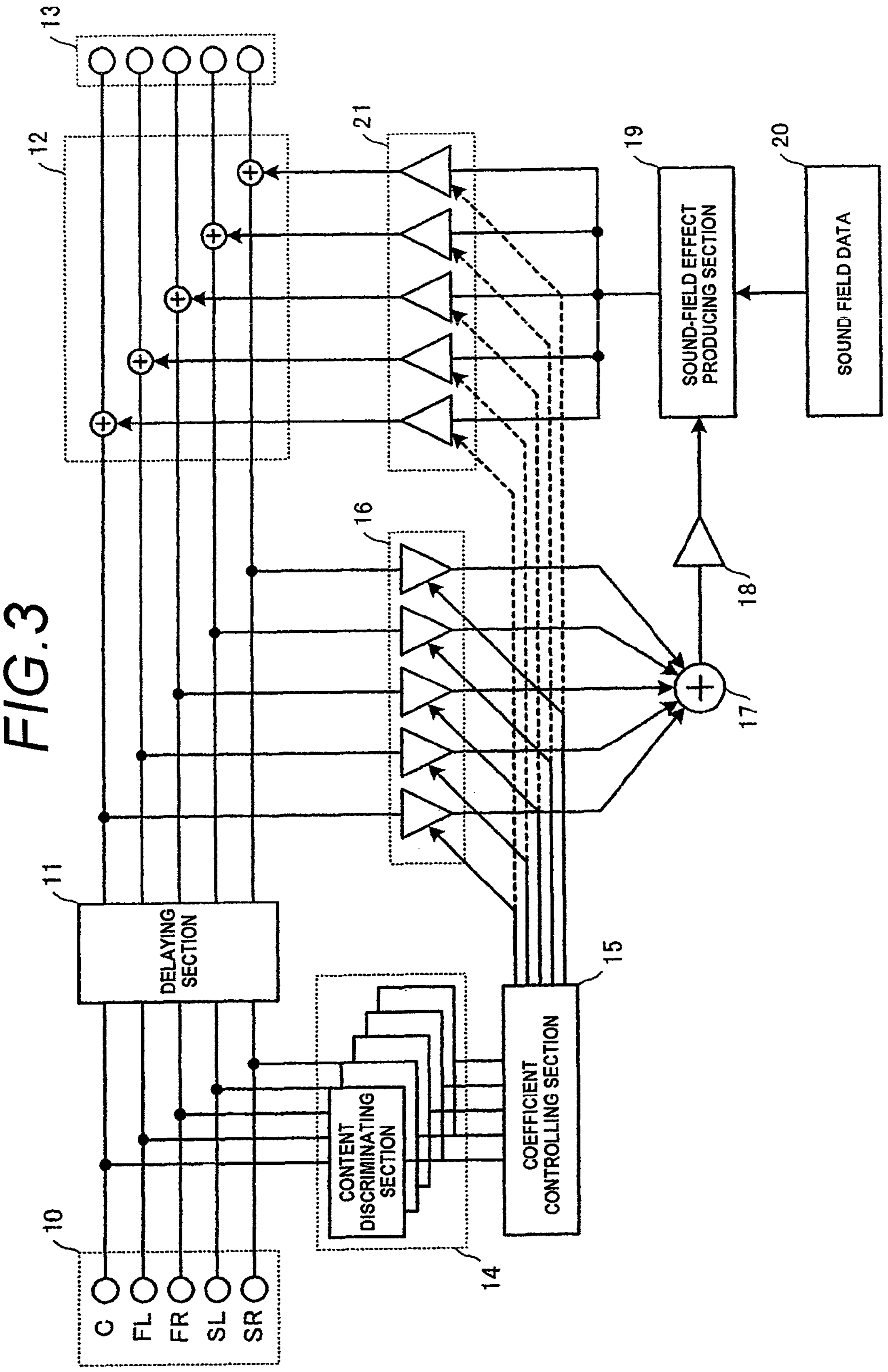
FIG. 3 is a block diagram of the signal processing unit.

FIG. 3 is a block diagram showing a configurative example of the signal processing unit 4. The signal processing unit 4 is a functional unit for performing various processes such as equalizing, sound-field effect production, and the like, but only the configurative portion for producing the sound field effect is illustrated in FIG. 3. An inputting section 10 includes five inputting sections of a center channel inputting section, a front left channel inputting section, a front right channel inputting section, a surround left channel inputting section, and a surround right channel inputting section, and the audio signals on the channels (C, FL, FR, SL, SR) are input into five inputting sections respectively.

The explanation of the individual channel in the configurative portion in which five channels are provided in parallel, like the above inputting section 10, will be omitted hereunder.

The audio signals being input from the inputting section 10 are input into a content discriminating section 14 of an acoustic type acquiring section and a delaying section 11. The content discriminating section 14 is provided to correspond to five channels in parallel, and discriminates the acoustic types of the audio signals on respective channels. The "acoustic types" signify the information indicating to which one of the talking voice, the musical sound, and other sound the audio signal corresponds.

The content discriminating section 14 discriminates sound as the talking voice, the musical sound, or other sound by measuring presence/absence of harmonic structure, modulation spectrum, overtone structure, rate of change in frequency, and the like.

Figure 4:
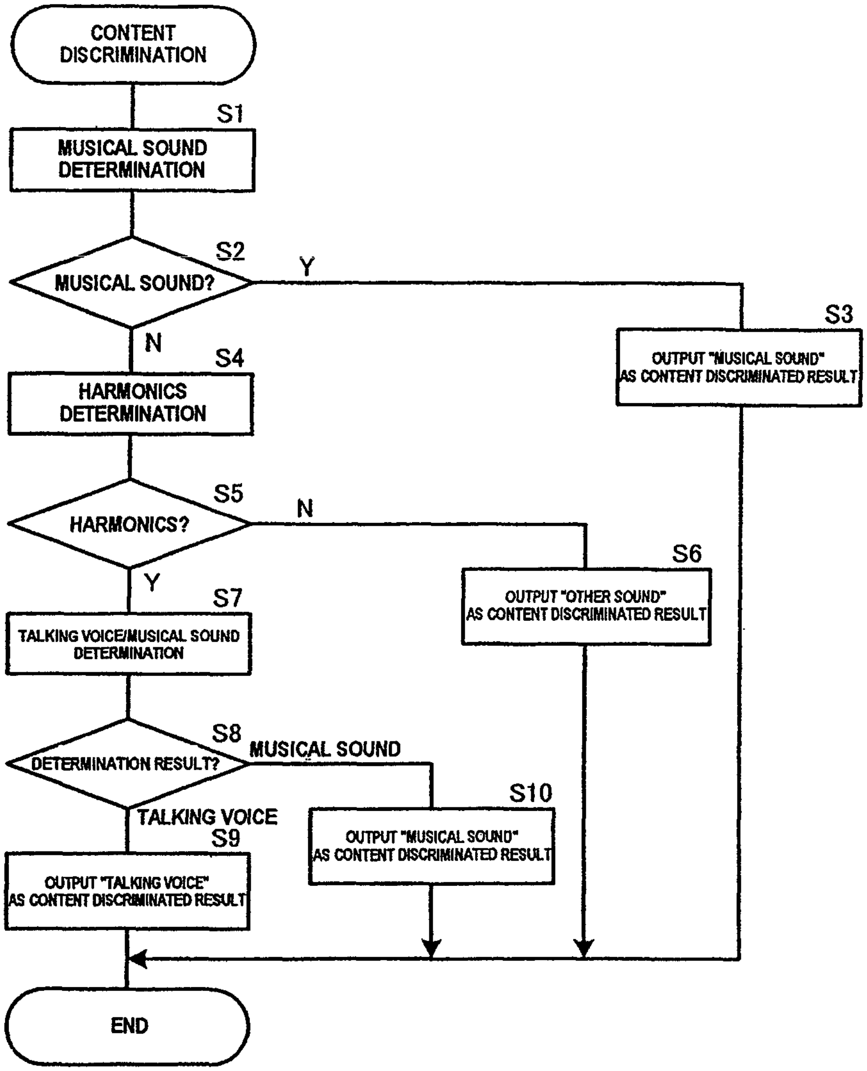
FIG. 4 is a flow chart for showing process of a content discriminating section of the signal processing unit.

A content discriminating process performed by the content discriminating section 14 will be explained with reference to FIG. 4. First, a musical sound determination process is performed. The musical sound determination process is a process for measuring a ratio of a scale frequency component among frequency components of the audio signals. In the process, sum of energies in overall frequency bands of the audio signals is found (calculated). Further, the audio signal passes through filters for filtering the frequency components of respective scales, energies of the output of the filters are summarized. Then, the sum of energies in overall frequency bands is compared with the sum of energies of the scale components. If the ratio of the scale components is not less than a predetermined value, the audio signal is determined to be musical sound (especially the musical sound of ensemble). If it is determined to be musical sound in the musical sound determination process (S2: Yes), "musical sound" is output as a content discriminated result (S3), and the process ends.

If it is not determined to be musical sound in the musical sound determination process (S2: No), a harmonic determination process is performed. The harmonic determination process is a process for determining whether the audio signal has harmonics, specifically, whether the audio signal has a spectrum structure including components of fundamental tone and harmonic tone thereof. In the harmonic determination process, the audio signal is subjected to Fourier transformation in short time, autocorrelation value of the frequency characteristic is found. Then, it is determined as presence of harmonics if the autocorrelation value is not less than a predetermined value. If it is determined as absence of harmonics in the harmonic determination process (S5: No), "other sound" is output as a content discriminated result (S6). On the other hand, if it is determined as presence of harmonics in the harmonic determination process (S5: Yes), since the audio signal is considered as talking voice or musical sound, talking voice/musical sound determination process is performed (S7). That is, the talking voice and the musical sound have harmonic components, whereas the acoustic sound such as ambient sound or sound effects do not have harmonic components.

In the talking voice/musical sound determination process, precise fundamental tone frequency (pitch) is calculated, and it is determined that the audio signal is musical sound or talking voice on the basis of the fact whether the pitch corresponds to scale frequency or whether there is large fluctuation in the pitch (whether there is change in the frequency). That is, if the pitch corresponds to scale frequency and there is large fluctuation in the pitch, the audio signal is determined as musical sound, and the otherwise is determined as a talking voice. If the determination result is talking voice, "talking voice" is output as a content discriminated result (S9). If the determination result is musical sound, "musical sound" is output as a content discriminated result (S10).

The discriminating approach is not limited this mode. For example, the talking voice may be detected by using the approach such as the formant detection, or the like. Further, the acoustic type of the audio signal in each channel may be input from the inputting section 10 as additional information.

Also, the content of respective channels may be decided finally by considering the results of a plurality of channels in combination. For example, such a deciding method may be employed that, when there are plural channels on which one's lines (talking voice) seems to be assigned, one channel whose likelihood of one's lines is highest out of them is decided as the channel of one's lines (talking voice) under the assumption that one's lines should be output from one channel only, and then remaining channels are decided as the channels of other sound.

In this embodiment, the content discriminating section 14 is provided to all channels to discriminate the contents on all channels. However, there is no necessity that the contents on all channels should always be discriminated, and the contents on a part (at least one) of channels (e.g., the center channel) may be discriminated. Also, there is no necessity that all contents of the talking voice, the musical sound or other sound should be discriminated, and only a part of contents (e.g., the talking voice) may be discriminated.

Here, the content discriminating section 14 discriminates the content based on the input audio signal waveform. In this case, when content information of the audio signal is contained in the content, or the like, a content information inputting section for inputting the content information may be provided instead of the content discriminating section 14.

In FIG. 3, the delaying section 11 delays the audio signal by a time period that is necessary for the content discriminating section 14 to discriminate the content of the audio signal. Accordingly, a control delay of the sound-field control caused due to the discriminated result of the content discriminating section 14 can be solved.

The discriminated result of the content discriminating section 14 is input into a coefficient controlling section 15. The coefficient controlling section 15 decides a controlled amount of sound field of the audio signals on respective channels in response to the contents of the audio signals on respective channels. A controlled amount of sound field is decided by the rules shown in FIG. 2A or 2B. The content discriminating section 14 decides a controlled amount of sound field of the audio signals on respective channels, and outputs the coefficients that are used to control the audio signals at input levels corresponding to the controlled amount of sound field. The coefficients are input into a coefficient multiplying section 16.

The coefficient multiplying section 16 multiplies the audio signals delayed by the delaying section 11 by the coefficients input from the coefficient controlling section 15, and inputs the multiplied audio signals into an adding section 17. The coefficient multiplying section 16 is provided to correspond to five channels in parallel. The adding section 17 adds/ synthesizes the 5-channel audio signals that are multiplied by the coefficient respectively. The added/synthesized audio signal is controlled in level by a level controlling section 18. Then, the sound field effect containing the initial reflected sound and the reverberation sound is applied to the level-controlled signal by a sound-field effect producing section 19.

The sound-field effect sound generated by the sound-field effect producing section 19 (the reflected sound, the reverberation sound) are increased as the level of the audio signal that is input into the sound-field effect producing section 19 is higher. Accordingly, the extent of the sound field effect added to the audio signals on respective channels can be controlled by the coefficients that the coefficient controlling section 15 produces respectively.

The sound-field effect producing section 19 reproduces the reverberation of sounds in a hall, a room, or the like based on sound field data 20. That is, the sound-field effect producing section 19 produces the initial reflected sound and the reverberation sound that are created in a hall or a room. This process contains the filtering process applied to simulate a change of the frequency characteristic caused by the spatial propagation or the reflection, the process of producing the initial reflected sound by means of the delay and the coefficient multiplication, the process of producing the rear reverberation sound, and the like.

The sound-field effect sound produced by the sound-field effect producing section 19 is added to the dry audio signals via a coefficient multiplying section 21 and an adding section 12. The added result is output by an outputting section 13. The coefficient multiplying section 21 and the adding section 12 are provided to correspond to five channels in parallel. In general, the channel from which the talking voice such as one's lines, etc. are output should have higher articulation of the talking voice than no sound-field effect sound is added to the channel. Therefore, an adding gain of the sound-field effect sound to the channel for the talking voice is set to 0 by the coefficient multiplying section 21.

The coefficient being input into the coefficient multiplying section 21 may be set by the coefficient controlling section 15. The coefficient of the channel from which the talking voices are output is set to "0", and the coefficients of other channels are set to "1". Also, the value of the coefficient may be changed to an intermediate value between "0" and "1" every channel.

According to such control, the rich sound field effect is produced with soundscape in respective channels in a period in which the sounds other than one's lines are reproduced, while the excessive reverberation is suppressed by reducing an amount of sound field effect added to one's lines when one's lines are reproduced. As a result, both the rich sound field effect and the one's articulate lines can be achieved.

<Switching Timing of Controlled Amount of the Sound Field Effect>

Figure 5A:
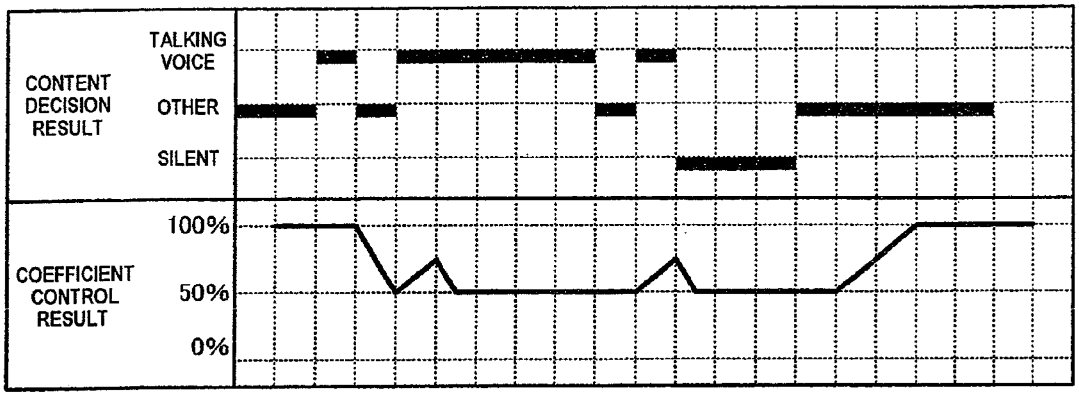
FIGS. 5A to 5C are time charts showing an example of coefficient control applied to control a level of a sound field effect respectively.
Figure 5B:
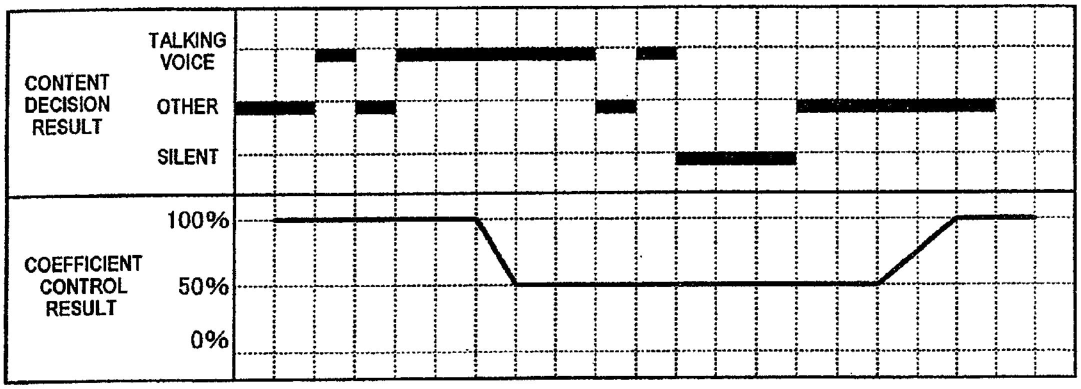
Figure 5C:
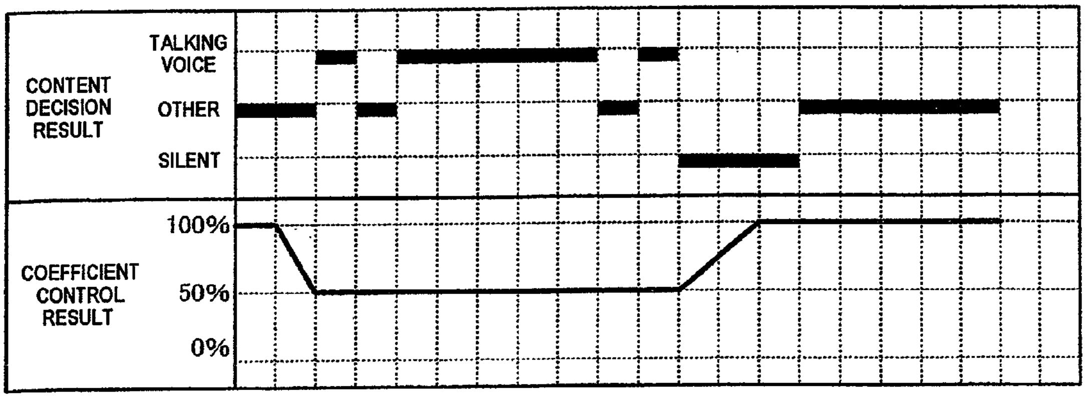

FIGS. 5A to 5C are time charts showing a correlation between the content decision result of the audio signals in the content discriminating section 14 and the coefficient control result to control an amount of sound field effect.

In this example, an amount of coefficient control applied when the sounds except the talking voices (the musical sounds, other sounds) are detected is set to 100%, and an amount of coefficient control applied when the talking voices are detected is controlled to 50%. In this case, since a sharp change in an amount of control causes the unstable sound field effect, an amount of control is changed while taking a predetermined time. In this example, when the talking voices are detected, the coefficient control is applied in such a way that an amount of control reaches 50% in one decision time (e.g., about 40 ms to several hundred ms). Also, when the sounds except the talking voice are detected, the coefficient control is changed in such a way that an amount of control returns to 100% in two decision times. Also, an amount of preceding control is still held during a silent (the reproduced sound is below a certain level) period.

FIG. 5A is an example in which an amount of delay of the delaying section 11 is set to 0 and the discriminated result of the content of the audio signals is reflected directly on an amount of control in real time. When the talking voice is discriminated at a certain decision time, an amount of control is decreased to 50% in a next decision time. Also, when the sounds except the talking voice (musical sound, other sound) is discriminated at a certain decision time, an amount of control is increased to 100% in next two decision times. According to this method, an amount of delay of the audio signals can be set to 0 and a control delay can be reduced to the lowest minimum, nevertheless a fluttering (chattering) of an amount of control is caused in some cases when the talking voice and other sound are switched in a short time.

FIG. 5B shows an example in which the chattering is removed. In this method, a change in an amount of control is started on a basis of the control in FIG. 5A when the same decision result continues in two decision periods. The fluctuation in an amount of control (increase/decrease in a short time) can be suppressed by enhancing the certainty of the decision result in this manner. In the illustrated example, since a continued time of the same decision result is depicted shortly for the purpose of explanation, it appears that the delay of control is larger than a change of the reproduced sound. Actually the continued times of respective situations are sufficiently longer than the decision time in many cases, and therefore the stable control can be achieved although a slight control delay is caused.

FIG. 5C is an example in which, after the chattering is removed as in FIG. 5B, a timing of the audio signals is rendered to coincide with a control timing by delaying the audio signals. In this method, the timing of the audio signals is adjusted by delaying the output of the reproduced sounds such that a change of an amount of control is synchronized with a change in the content of the audio signals.

In this example, the audio signals are delayed by five decision periods, and a time point at which the content of the audio signals start to change is set as a starting point of the control of an amount of control. Accordingly, the control can be applied without delay. Here, in the case of the audio signals that are synchronized with the video signals such as the video content, or the like, it is preferable that the video should also be delayed to synchronize with the audio signals.

Here, in this example, the content of the audio signals on one channel are discriminated, and an amount of control of the effect on the channel is controlled based on the discriminated result. In this case, the coordinated control to adjust an amount of control of the effect mutually between a plurality of channels may be applied, based on the discriminated results of a plurality of channels.

Here, the attack time and the release time are not limited to one decision time and two decision times respectively. These times may be set to 0 (an amount of control is changed sharply).

<Various Variations>

In the configuration of the signal processing unit in FIG. 3, the levels of the audio signals on respective channels being input into the sound-field effect producing section 19 are controlled, based on the content that are discriminated by the content discriminating section 14, and accordingly the sound field effect being added to the audio signals on respective channels is controlled.

Variations of the signal processing unit will be explained with reference to FIG. 6 to FIG. 8 hereunder. Here, the same reference numerals are affixed to the same configurative portions as the signal processing unit shown in FIG. 3 in the following variations, and therefore their explanation will be omitted hereunder.

Figure 6:
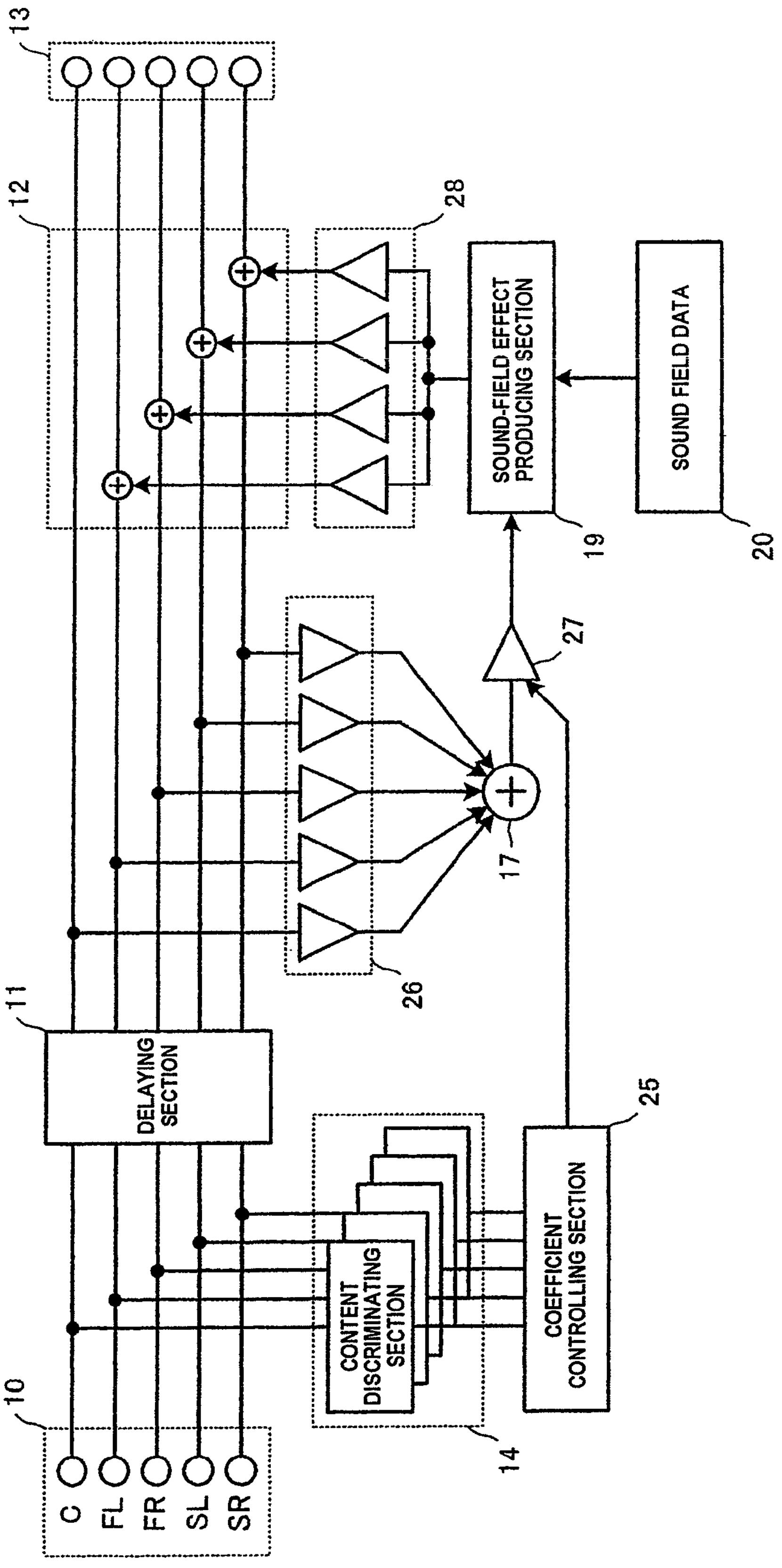
FIG. 6 is a block diagram of a second embodiment of the signal processing unit.

FIG. 6 is a block diagram showing a first modified example. In a configuration in FIG. 6, the discriminated results of the content discriminating section 14 are input into a coefficient controlling section 25. The coefficient controlling section 25 outputs a level coefficient, which is used to control an input level of the added/synthesized audio signal being input into the sound-field effect producing section 19, in response to the content of the audio signals on respective channels. This level coefficient is a level controlling section 27. That is, in the configuration in FIG. 6, the coefficient of the level controlling section 27 that multiplies the added signal with the coefficient is variable, and the coefficient of a coefficient multiplying section 26 that multiplies the audio signals on respective channels with the coefficient respectively is fixed. Here, the "added signal" means the audio signal that is output from the adding section 17 by adding the audio signals on respective channels.

In the coefficient multiplying section 26 that multiplies the audio signals on respective channels with the coefficient respectively, the coefficients decided under the assumption that the talking voices such as one's lines, etc. are assigned to the center channel C, which is the most common channel assignment, are set fixedly. That is, respective coefficients of the center channel: small (e.g., 50%), the front left/right channels: large (e.g., 100%), and the surround left/right channels: middle (e.g., 80%) are set fixedly in the coefficient multiplying section 26.

While the coefficient controlling section 25 is detecting such a situation that the talking voices such as one's lines, etc. are assigned to the center channel C, based on the discriminated results of the content discriminating section 14, the coefficient controlling section 25 sets the level coefficient that is output to the level controlling section 27 to "large" (for example, set to 1) so as to give large sound-field effect. When the coefficient controlling section 25 detects such a situation that the talking voices are assigned to the channel except the center channel C, the coefficient controlling section 25 controls the level coefficient being output to the level controlling section 27 to "small" (for example, set to 0) so as to lower the overall sound-field effect and not to lower the articulation of the talking voices.

Accordingly, such a situation can be prevented that the large sound field effect is added to the talking voices. In this case, the sound field effect being added to all channels is controlled to "small" in total. However, this control makes it easier for the listener to listen to the talking voices such as one's lines, etc. than case where the articulation of the talking voices is decreased by adding strongly the sound field effect to the talking voices such as one's lines, etc. Also, it is rarely the case that one's lines are assigned to the channels except the center channel C, so that it may be considered that the influence can be suppressed small.

The sound-field effect sound signal, to which the sound field effect containing the initial reflected sound, the reverberation sound, or the like is added by the sound-field effect producing section 19, is added to the channels via the coefficient multiplying section 28 except the center channel C as the channel to which the talking voices might be assigned.

In this manner, in the configuration in FIG. 6, the configuration is simplified by fixing the level to the most common setting. Also, when one's lines are reproduced on the channels except the center channel C, the decrease of the articulation of one's lines is prevented by decreasing the effect adding level as a whole.

Figure 7:
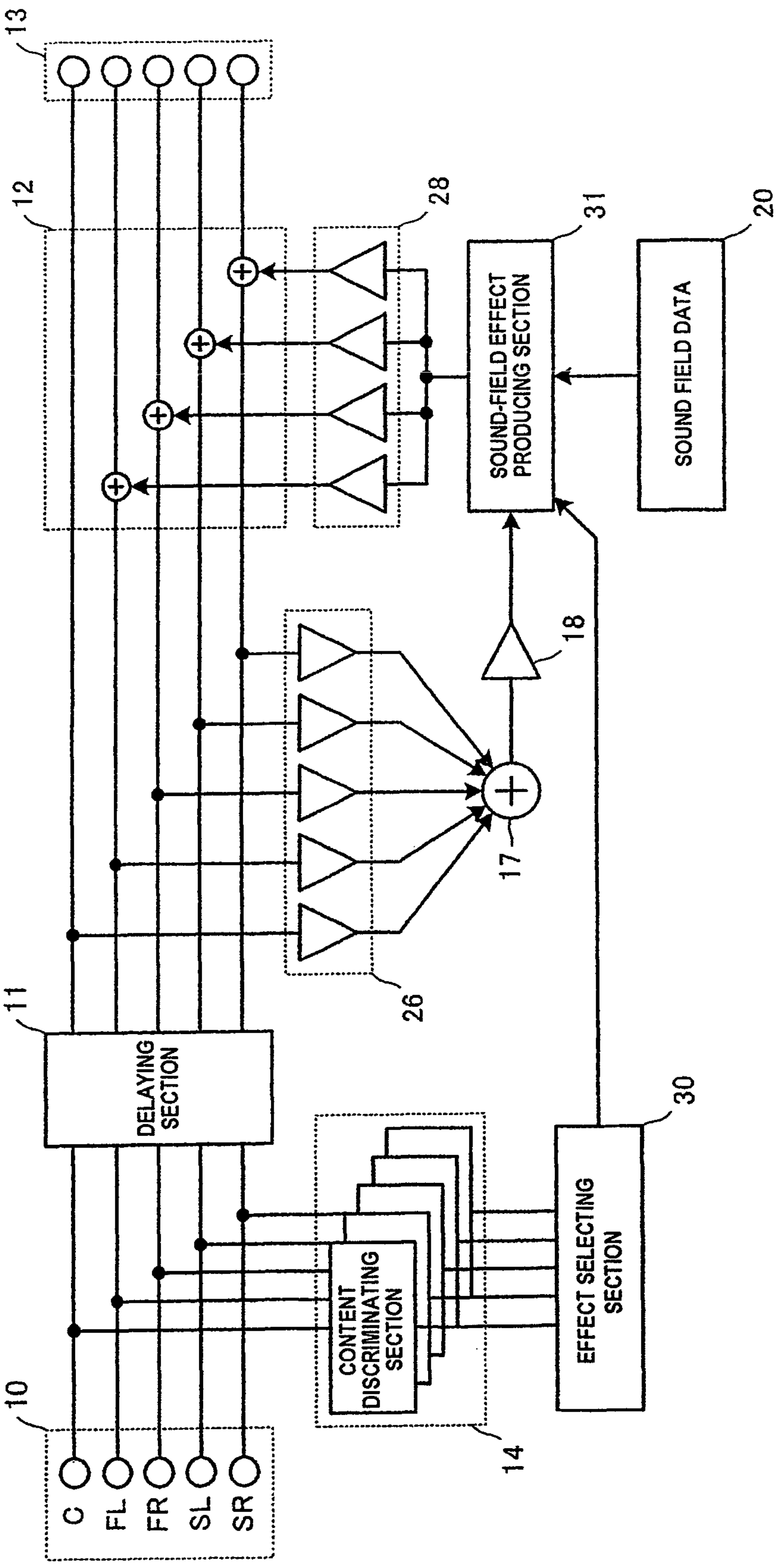
FIG. 7 is a block diagram of a third embodiment of the signal processing unit.

FIG. 7 is a block diagram showing a second modified example. A configuration of the signal processing unit shown in FIG. 7 is similar to that shown in FIG. 6, but an effect selecting section 30 is provided in place of the coefficient controlling section 25 shown in FIG. 6. That is, the sound field effect that a sound-field effect producing section 31 adds is switched based on the discriminated result of the content discriminating section 14. Accordingly, the effect that responds to the discriminated content out of plural effects can be added. For example, when one's lines are reproduced on the channels except the center channel C, the sound field effect in which the reflected sound and the reverberation sound are small is selected, or the like.

In this case, the configuration for selecting the type of the sound field effect in response to the discriminated result shown in FIG. 7 and the configuration for controlling the amount of the sound field effect shown in FIG. 3 and FIG. 6 may be combined mutually.

Figure 8:
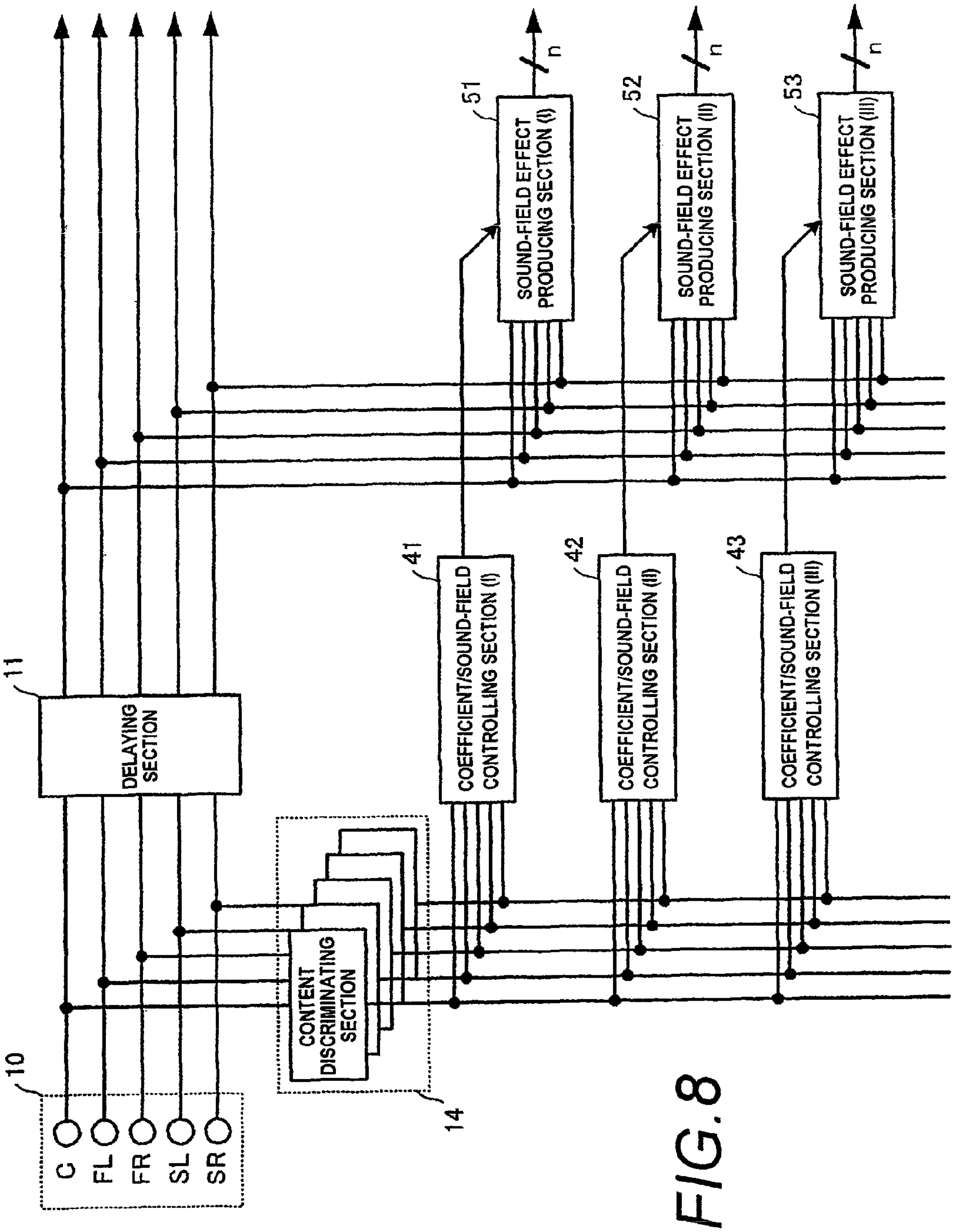
FIG. 8 is a block diagram of a fourth embodiment of the signal processing unit.

FIG. 8 is a block diagram showing a third modified example. The signal processing unit shown in FIG. 8 includes a plurality of sound-field effect producing sections 51 to 53. The sound-field effect producing sections 51 to 53 add the sound field effect in parallel to the audio signals on plural channels respectively. The parameters (coefficients) of the sound field effects and the types of the sound field effects in the sound-field effect producing sections 51 to 53 are controlled by coefficient/sound-field controlling sections 41 to 43 based on the sound field effects of the content discriminating section 14. Accordingly, the fine sound-field control can be attained in response to the content of the audio signals that are reproduced on respective channels. In this case, like the case of the signal processing unit in FIG. 3, the sound-field effect sounds (the reflected sounds, the reverberation sounds) being output from the sound-field effect producing sections 51 to 53 are added to the dry audio signals via coefficient multiplying sections having the same configuration as the coefficient multiplying section 21 in FIG. 3 or the coefficient multiplying section 28 in FIG. 6 on respective channels respectively.

In the above embodiments, the sound field effect by which the initial reflected sounds or the reverberation sounds is added to the audio signals is explained. But the signal processing in the present invention is not limited to the sound field effect.

Also, in the above embodiments, the explanation is made by taking the multi-channel audio signal of 5.1-channels as an example. The number of channels of the multi-channel audio signal is not limited to 5.1-channels.

What is claimed is:

1. A signal processing method, comprising:

inputting audio signals on a plurality of channels;

acquiring an acoustic type of an audio signal on at least one channel of the audio signals, the acoustic type being acquired every decision period;

determining a target amount of sound-field effect for the acquired acoustic type;

controlling a characteristic of sound-field effect, that includes at least a reflected sound or a reverberation sound, applied to the audio signals based on the acquired acoustic type; and performing a sound-field effect process with respect to at least one of the audio signals on the plurality of channels based on the controlled characteristic of sound-field effect by changing an amount of sound-field effect, the sound-field effect process being started when the acquired acoustic type is continuously the same in two or more decision periods, wherein when it is determined that the acquired acoustic type is changed from a previous acoustic type, the amount of sound-field effect is changed gradually to the target amount over at least one decision period.

2. The signal processing method according to claim 1, wherein acquiring comprises:

detecting, in the audio signal of a determination target, at least one of: a ratio of energies in a scale frequency component among all energies, whether the audio signal has a spectrum structure including components of fundamental tone and harmonic tone thereof, and change in frequency; and performing determination of which type of talking voice, musical sound, or other sound the audio signal indicates based on a result of the detection.

3. The signal processing method according to claim 2, wherein performing the determination of which type of talking voice, musical sound, or other sound the audio signal indicates is with respect to audio signals on two or more channels, and performing the determination comprises determining which audio signal on a channel indicates the talking voice among the audio signals on the two or more channels.

4. The signal processing method according to claim 2, wherein controlling the characteristic of sound-field effect comprises decreasing a sound-field effect applied to the audio signal which is determined to indicate the talking voice.

5. The signal processing method according to claim 4, wherein when a channel of the audio signal determined to indicate the talking voice is switched, controlling the characteristic of sound-field effect comprises:

gradually decreasing the sound-field effect applied to the audio signal which is determined to indicate the talking voice; and gradually increasing the sound-field effect applied to the audio signal which is determined to indicate not the talking voice.

6. The signal processing method according to claim 4, wherein controlling the characteristic of sound-field effect further comprises controlling a sound-field effect applied to the audio signal for a channel which is determined to indicate the musical sound to be an amount adjusted in accordance with an amount of sound-field effect for the other channels.

7. The signal processing method according to claim 2, wherein controlling the characteristic of sound-field effect comprises controlling a sound-field effect applied to the audio signal which is determined to indicate the musical sound to be large, more than that applied when determined to indicate the talking voice and more than that applied when determined to indicate the other sound.

8. The signal processing method according to claim 1, wherein inputting audio signals comprises inputting audio signals on the plurality of channels including a center channel, performing the sound-field effect process comprises performing the sound-field effect process including reverberation effect process with respect to signals in which the audio signals on the plurality of channels are synthesized to each other; and performing an adding process for adding the signals subjected to the sound-field effect process to the audio signals on channels except for the center channel, acquiring comprises determining which audio signal on a channel indicates the talking voice, and when the audio signal on a channel except for the center channel is determined to indicate the talking voice, controlling the characteristic of sound-field effect comprises decreasing a level of the signals to be added to the audio signals on the channels except for the center channel.

9. The signal processing method according to claim 1, wherein a time for increasing the amount of sound-field effect is different from that for decreasing.

10. The signal processing method according to claim 1, wherein the input audio signals are delayed to match a timing of outputting the audio signals with a timing of starting the corresponding sound-field effect process.

* * * * *